United States Patent [19]

Whikehart

[11] Patent Number: 5,414,735
[45] Date of Patent: May 9, 1995

[54] METHOD AND APPARATUS FOR NORMALIZING COMPONENTS OF A COMPLEX SIGNAL

[75] Inventor: William J. Whikehart, Novi, Mich.

[73] Assignee: Ford Motor Company, Dearborn, Mich.

[21] Appl. No.: 51,919

[22] Filed: Apr. 26, 1993

[51] Int. Cl.[6] .................. H03D 3/22; H04L 27/22
[52] U.S. Cl. ...................... 375/332; 329/304
[58] Field of Search .................. 375/39, 54, 86; 455/205; 370/20; 329/321, 315, 304

[56] References Cited

U.S. PATENT DOCUMENTS 4,592,074  5/1986  Whikehart .
5,230,099  7/1993  Leper .................... 455/324

OTHER PUBLICATIONS

Solid State Radio Engineering, by Krass, Bostian & Raab, published by John Wiley & Sons, 1980.

"Digital Invading Analog Territory", by Ron Wilson, Electronic Engineering Times, Oct. 5, 1992, pp. 39–40.

Primary Examiner—Stephen Chin
Assistant Examiner—Don Vo
Attorney, Agent, or Firm—Roger L. May; Mark L. Mollon

[57] ABSTRACT

A method and apparatus for normalizing the I and Q components of a complex signal is provided which includes an iterative determination of the multiplier constant required for normalization. The I and Q components are squared and added together to create a digital word A constrained between certain limits. An iterative approach is implemented to arrive at a multiplier constant K which is equal to $$\frac{1}{\sqrt{A}}$$

without resorting to the use of multipliers. The constant K is then used to normalize the I and Q components.

8 Claims, 5 Drawing Sheets

METHOD AND APPARATUS FOR NORMALIZING COMPONENTS OF A COMPLEX SIGNAL

TECHNICAL FIELD

This invention relates to digital signal processing and more particularly to a method and apparatus for normalizing a complex signal. The invention has particular application in receivers that process frequency modulated signals.

BACKGROUND ART

Prior art communication receivers use digital signal processing (DSP) for many of the basic receiver functions such as frequency translation, filtering, and demodulation. See for example, U.S. Pat. No. 4,592,074 which uses DSP for frequency translation and filtering. In general, DSP permits receivers to be designed with higher performance, accuracy, and flexibility.

FIG. 1 is a block diagram of a prior art FM receiver, with signal demodulation and other functions performed by DSP. Analog front end circuitry processes the signal received at the antenna and inputs the processed analog signal to an analog-to-digital converter (A/D), which digitizes the signal. The analog processing may include gain, frequency translation, and filtering. The digital output of the A/D converter is processed by DSP circuitry that may perform gain, frequency translation and filtering functions in the digital domain to isolate the signal in the desired receiver channel. The desired signal is then input to the FM demodulator, which outputs the baseband signal, which is the FM composite signal for standard FM broadcast.

FM can be described mathematically as phase modulation of a carrier by the integral of the modulating (or baseband) signal, as discussed in *Solid State Radio Engineering*, by Krauss, Bostian, and Raab, published by John Wiley and Sons, 1980. Thus, the demodulation process for FM can be described as the derivative of the phase of the modulated carrier.

It is common in DSP-based receivers to process the receive signal in complex from, i.e. with real (in-phase or I) and imaginary (quadrature-phase or Q) components. In general, using a complex representation has advantages in frequency translation and demodulation, and allows sample rates to be reduced. A single carrier in complex form can be represented diagrammatically as a single phasor in the real-imaginary signal plane, with the real and imaginary coordinates of the phasor's tip equal to I and Q respectively, as shown in FIG. 2. The magnitude M of the carrier is the length of the phasor, and the phase of the carrier is the angle P from the real axis, as shown. Thus, one prior art FM demodulation scheme is to calculate the phase equal to the arctangent of Q divided by I, then take the derivative of the phase to obtain the baseband signal. This scheme has two problems: calculation of arctangent is difficult, and the arctangent function in general gives a result that is discontinuous due to wrap around from +pi to −pi and vice-versa. It can be easily shown using standard derivative tables that the derivative of the arctangent of Q divided by I can be simplified to the following function.

$$S(t) = \frac{I(t)\frac{dQ(t)}{dt} - Q(t)\frac{dI(t)}{dt}}{I(t)^2 + Q(t)^2} \quad (1)$$

where
- S(t)=desired baseband signal,
- I(t)=in-phase carrier component,
- Q(t)=quadrature-phase carrier component.

The denominator of (1) is the square of the magnitude of the carrier phasor. The magnitude of the phasor is the square-root of the sum of the squares of I(t) and Q(t), and can also be considered the norm of the vector [I(t) Q(t)]. If K is defined as the inverse of the magnitude, and if $I_1(t)=KI(t)$ and $Q_1(t)=KQ(t)$, then (1) can be re-written as follows.

$$S(t) = I_1(t)\frac{dQ_1(t)}{dt} - Q_1(t)\frac{dI_1(t)}{dt} \quad (1)$$

Equation (2) can be viewed as the modified demodulator. The magnitude of the phasor formed by $I_1(t)$ and $Q_1(t)$ is exactly 1 due to the value of K. Thus, multiplying I (t) and Q(t) by K to obtain $I_1(t)$ and $Q_1(t)$ in effect "normalizes" the phasor to magnitude 1. This removes any amplitude variation of the carrier phasor, and thus performs the same function as a limiter in an analog FM demodulator.

The demodulation process thus consists of normalizing the complex signal, then using the modified demodulator to demodulate the normalized signal, as shown in FIG. 3. Normalization is performed by calculating K as defined above, and then multiplying I and Q by K. The derivatives in (2) (as well as in (1)), can be calculated using known methods, such as FIR or IIR filter structures.

K can be calculated from a polynomial function of $I^2+Q^2$. However, many terms, and thus multiplications, are needed for high accuracy of K. Alternatively, the square root of $(I^2+Q^2)$ can be calculated using a square-root algorithm, such as a polynomial algorithm or Booth's algorithm. Then K can be calculated using a 1/x function, such as binary long division. Still another method is to use Newton-Raphson iteration. In terms of hardware or software implementations, all of these approaches require an excessive amount of processing power to obtain K.

In accordance with the present invention a method and apparatus is provided which arrives at a value of K in a iterative manner, which in relation to the prior art requires a smaller amount of processing power, thus reducing the cost of implementing the function.

BRIEF DESCRIPTION OF THE DRAWINGS

A more complete understanding of the present invention may be had from the following detailed description which should be read in conjunction with the drawings in which.

DETAILED DESCRIPTION OF PREFERRED EMBODIMENT

Figure 1:
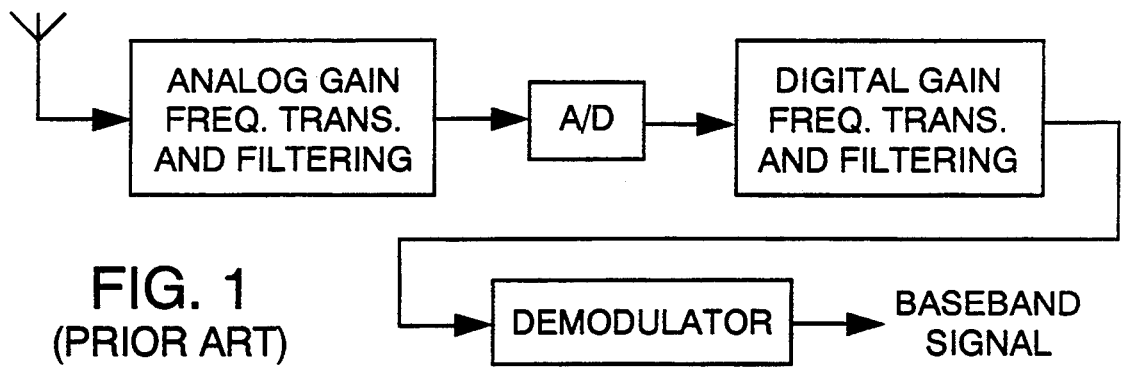
FIG. 1 is a block diagram of a prior art FM receiver using digital signal processing.
Figure 2:
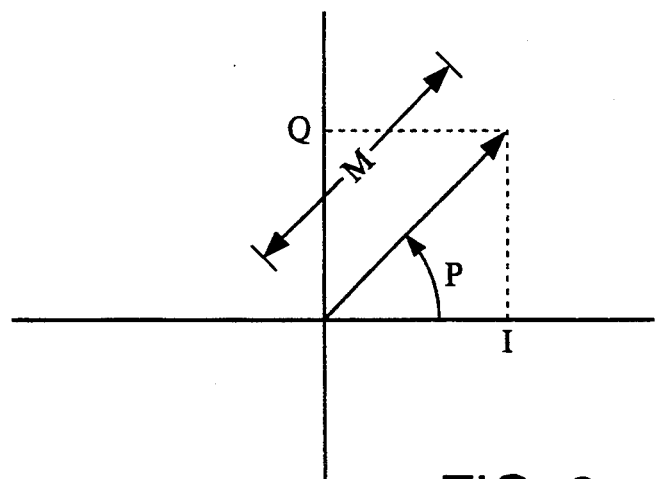
FIG. 2 is a phasor diagram showing the real and imaginary components of a carrier.
Figure 3:
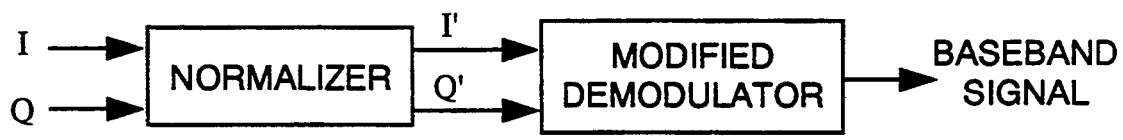
FIG. 3 is a block diagram of a portion of an FM receiver utilizing the normalizer of the present invention.
Figure 4A:
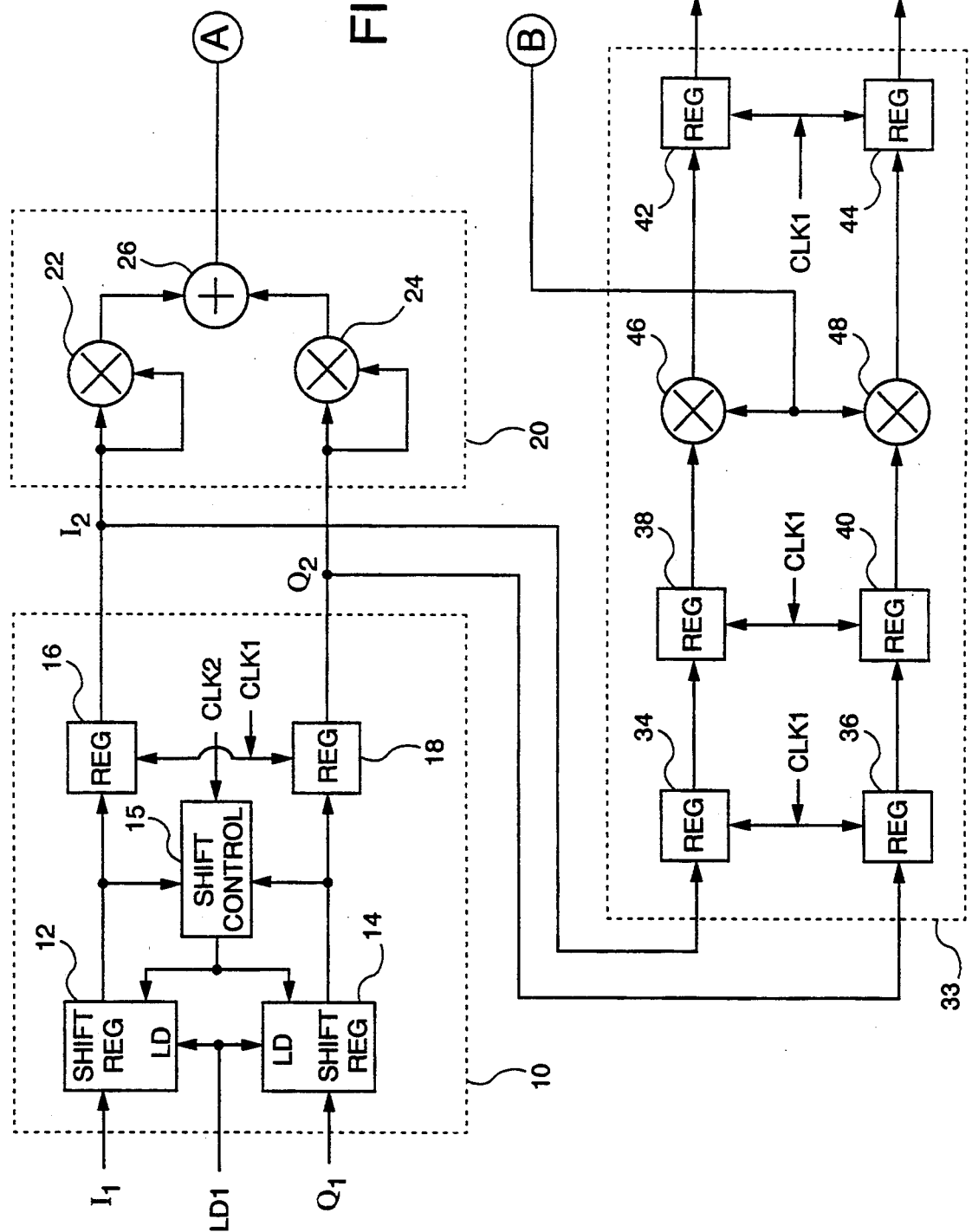
FIGS. 4a and 4b form a detailed block diagram of one embodiment of the normalizer of the present invention.
Figure 4B:
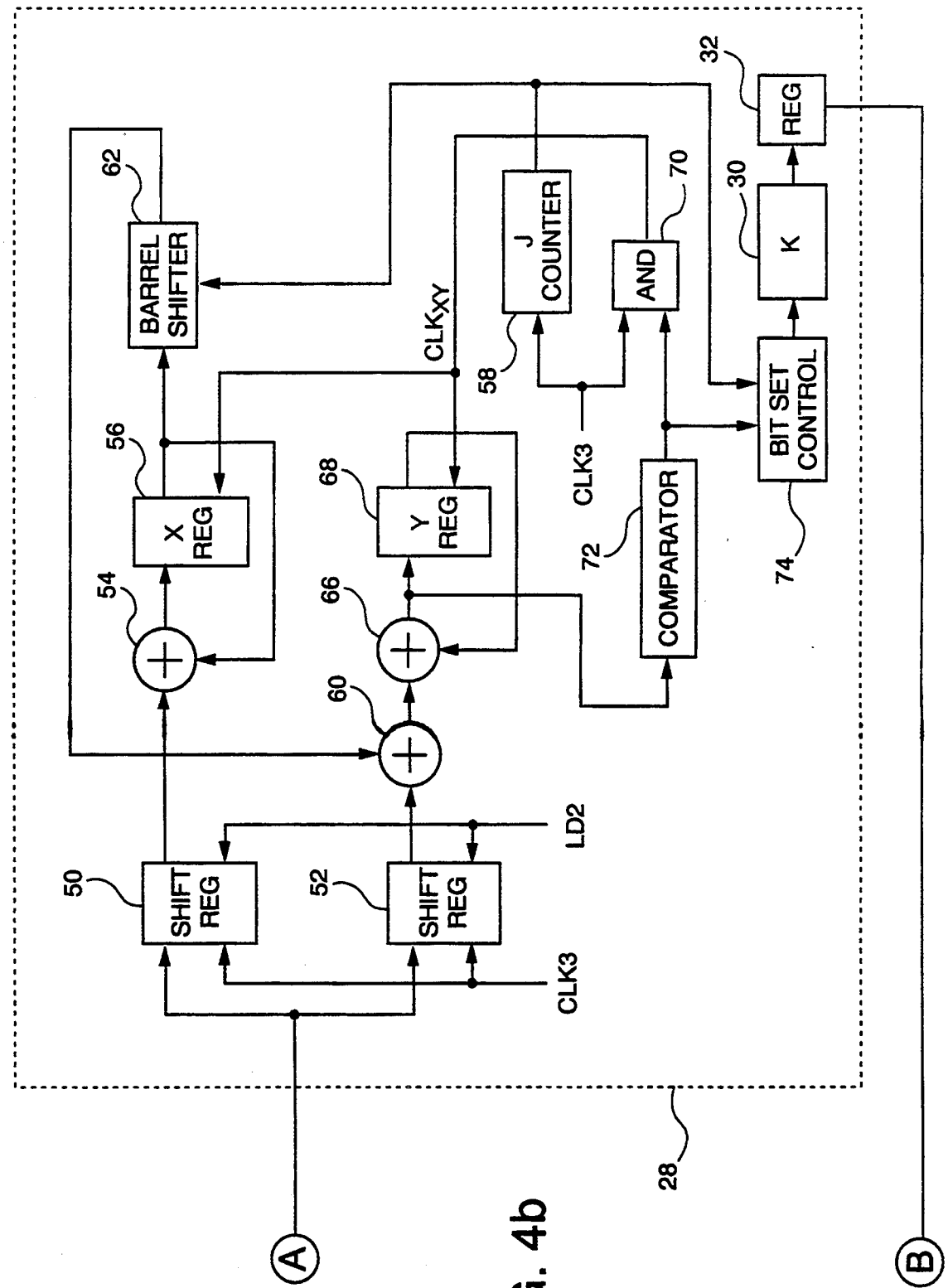

Referring now to FIGS. 4a and 4b and initially to FIG. 4a, a first embodiment of the normalizer of the present invention is shown. It should be understood in the following discussion that the values of the range limits of signals in the system are dependent on the number system selected to represent the signals. However, selection of a particular number system does not change the operation of the method, but only how signals are represented mathematically. A well-known number system is the 2's complement, fixed-point fractional number system. When this system is used, the range of numbers that can be represented is $-1.0$ to $1.0-\alpha$, where $\alpha$ is the value of the least-significant-bit (LSB) of the number represented. In the following description, it is assumed that fixed-point, 2's complement, fractional hardware is used. Thus, operations are performed in certain ways to limit all variables and coefficients to the range $\geq -1.0$ and $< +1.0$.

The normalizer comprises a first stage generally designated 10 that performs a coarse normalization on the inputs $I_1$ and $Q_1$ to produce $I_2$ and $Q_2$ so that the absolute value of at least one of the outputs is equal to or greater than 0.25 and the absolute value of each output is less than 0.5. The digital multi-bit words $I_1$ and $Q_1$ are parallel loaded into shift registers 12 and 14 respectively under the control of load signal LD1 at a rate of f1, where f1 is the sample rate of the system. The shift control logic 15 shifts the bits in the registers 12 and 14 under control of clock signals CLK2 and also performs the logic necessary to detect the intermediate shifted values of $I_1$ and $Q_1$ and stop shifting when the absolute value of the $I_1$ and $Q_1$ meet the condition set out above. The results of this shifting operation are loaded into registers 16 and 18 at rate f1, by a clock signal CLK1.

If $I_1 <> 0$ or $Q_1 <> 0$, $I_1$ and $Q_1$ are shifted left or right a bit at a time until:

$$\frac{L}{2} \leq |I_2|, \text{ or} \tag{3}$$

$$\frac{L}{2} \leq |Q_2|, \text{ and} \tag{4}$$

$$|I_2| < L, \text{ and} \tag{5}$$
$$|Q_2| < L. \tag{6}$$

If $I_1 = 0$ and $Q_1 = 0$, no shifting is required, so that $I_2 = 0$ and $Q_2 = 0$. The limits in (3) to (6) are integer powers of 2. This allows the range checking associated with the coarse normalization to be performed by directly checking the three most significant bits (MSBs) of $I_2$ and $Q_2$. Arbitrary limits could be used, but absolute-value functions and full comparators would be needed in that case. Also, if the maximum limit of each of $I_2$ and $Q_2$ is less than L (up to but not including L), then at least one of these two signals will be $\geq L/2$, due to the fact that the coarse normalization is performed by bit shifting. The value of L should be a power of 0.5 to allow the simple range checking indicated above. A value of $L = 0.5$ is preferred for this number system.

Registers 16 and 18 are provided to store $I_2$ and $I_3$ respectively, to insure that $I_2$ and $Q_2$ are available to subsequent processing for the full length of the sample period 1/f1. If $I_1$ and $Q_1$ each have N1 bits resolution, no more than $N1-1$ shifts will be needed.

In a second stage generally designated 20, the outputs of the first stage $I_2$ and $Q_2$ are respectively squared by multipliers 22 and 24 and summed in adder 26. The output of the adder 26 is expressed as:

$$A = I_2^2 + Q_2^2. \tag{7}$$

In view of the coarse normalization performed by stage 10, and a value of $L = 0.5$, the output A of the adder 26 will be:

$$0.0625 \leq A < 0.5, \text{ or} \tag{8}$$

$$A = 0. \tag{9}$$

The range in (8) is a mathematical result of the range on $I_2$ and $Q_2$, and the number system used. In a 2's complement number system, if the upper limit of each of $I_2$ and $Q_2$ is $L-\alpha$, then the upper limit of A occurs when both $I_2$ and $Q_2$ are at their upper limit, so the upper limit of A is $2(L-\alpha)^2$. The lower limit of A occurs when one of $I_2$ or $Q_2$ is at its lower limit $L/2$, and the other signal is 0, so the lower limit of A is $(L/2)^2$. Note, if $L = 1.0$, then A can exceed 1.0, which is outside the limits of the number system. However, if $L = 0.5$ as stated above, A will not exceed 1.0. With $L = 0.5$, the maximum value of A is $2(0.5-\alpha)^2$, or just below 0.5. Also, with $L = 0.5$, at least one of $I_2$ and $Q_2$ will be $\geq 0.25$, and thus A will be at least 0.0625. Similar relationships will be present for any number system selected.

The digital multi-bit word A is input to a third stage generally designated 28 shown in FIG. 4b. In stage 28, an iterative process is performed, one bit at a time, to find a multi-bit word of value K in a register 30 such that:

$$K^2 A = 0.0625. \tag{10}$$

The K register has NK bits, numbered from $NK-1$ (MSB) to 0 (LSB).

From the equations above, $0 < K \leq 1$. However, if $A = 0.0625$, then to keep $K < 1.0$, as required in fractional representation, K is forced to the largest fractional value available. Since K is known to be positive, no sign-bit need be present in K. The details of the iterative process will be described hereinafter in detail. The final value of K is clocked into register 32, so that it is available for one complete sample period.

In a fourth stage (FIG. 4a) generally designated 33, the final outputs $I_3$ and $Q_3$ are calculated, as follows, and with the indicated order of operations to limit all numbers to within the number system.

$$I_3 = 4(KI_2), \text{ and} \tag{11}$$

$$Q_3 = 4(KQ_2). \tag{12}$$

By using (7) and (10) to (12), it can be shown that $I_3$ and $Q_3$ are such that:

$$I_3^2 + Q_3^2 = 1.0. \tag{13}$$

Registers 34, 36, 38, and 40 are for time alignment of $I_2$ and $Q_2$ with the K output from Register 32. Registers 42 and 44 provide storage for the results of multipliers 46 and 48 respectively. The multiply by 4 operation, in (17) and (18) is performed by taking the proper bits from the intermediate values $KI_2$ and $KQ_2$ as provided at the outputs of multipliers 46 and 48. To accommodate the special case where $KI_2=0.25$, circuitry is included at the input of register 42 to compare the output of the multiplier 46 with the value 0.25 and if equal thereto, to load the value 1.0 $-\alpha$ into the register 42, as required for the number system. An identical process is used with multiplier 48 and register 44.

Returning to the third stage 28 in FIG. 4b, the iteration process determines the correct value of K one bit at a time, beginning with the most significant bit. The initial value of K in the register 30 is 0. For each iteration, $(K^2)A$ is calculated in an indirect manner that does not require multiplication. The value of K that is used assumes that the bit being determined in the iteration is equal to logic 1. Then, if $(K^2)A$ is $\leq 0.0625$, the bit in question in register 30 is actually set, otherwise, the bit is left clear.

Define:

$$X = KA, \qquad (14)$$

$$Y = (K^2)A, \text{ and} \qquad (15)$$

Define: J as the current iteration, with J running from 0 to NK-1. Then, for every iteration, $$K_1 = K \text{ with bit in question} = \text{logic 1.} \qquad (16)$$

$$\begin{aligned} X_{temp} &= K_1 A = [K + 2^{-J-1}]A \\ &= KA + [2^{-J-1}]A \\ &= X_{old} + A\,\text{shr}(J+1) \end{aligned} \qquad (17)$$

$$\begin{aligned} Y_{temp} &= K_1^2 A = \{[K + 2^{-J-1}]^2\}A \\ &= K^2 A + 2K[2^{-J-1}]A + \{[2^{-J-1}]^2\}A \\ &= Y_{old} + X[2^{-J}] + A[2^{-2J-2}] \\ &= Y_{old} + (X\,\text{shr}\,J) + (A\,\text{shr}\,(2J+2)). \end{aligned} \qquad (18)$$

where shr M indicates a shift right operation by M bits, which in effect multiplies the affected value by $0.5^M$.

The logic 28 implements equations (17) and (18). The multi-bit word A is loaded into registers 50 and 52 when the load input LD is enabled by the timing signal LD2. After loading register 50 with A, it's content is shifted one bit to the right by CLK3. The clock signal CLK3 is preferable K times the frequency of CLK1 so that one iteration occurs each CLK3 pulse. A J counter 58, clocked from CLK3, counts the number of iteration performed, counting from 0 to NK-1. The content of the register 50, after being shifted right by one bit position for each iteration, provides one of the multi-bit inputs to an adder 54 which outputs $X_{temp}$. The other input to the adder 54 is the output of an X register 56 which stores a previous output of the adder 54 as will be explained hereinafter. The output of the register 52, after being shifted right by two bit positions for each iteration by CLK3, provides one of the multi-bit inputs to an adder 60. The connections from the inputs of the adder 60 to the register 52 are offset by two bit positions to achieve a further multiplication of value A prior to addition to output of a barrel shifter 62, which provides the other input to the adder 60. The barrel shifter 62 receives and shifts the contents of X register 56 to the right by a number of bit positions equal to the value of the J counter 58. The output of the adder 60 provides one input to an adder 66 which outputs $Y_{temp}$. The other input to the adder 66 is the output of a Y register 68. The Y register 68 is loaded with the output of the adder 66 and the X register 56 is loaded with the output of the adder 54 by a timing signal CLKxy. CLKxy is derived from CLK3 through an AND gate 70 which is enabled whenever the output of the adder 66 is $\leq 0.0625$ as determined by the comparator 72. If the output of the adder 66 is $\leq 0.0625$, the X register 56 and the Y register 68 are updated with $X_{temp}$ and $Y_{temp}$ respectively from the adders 54 and 66, and the bit NK-J-1 is set in the K register 30 through bit set control logic 74. If the output of adder 66 is greater than 0.0625 no update of the registers 56 and 68 occurs and the bit in bit position NK-J-1 is not set. When the iterative process begins the X register 56 and Y register 68 are cleared, the J counter 58 is set to 0 and the K register 30 is set to 0. If for example the K register 30 is a 16 bit register then during the first iteration the value calculated by the adder 66 is checked and the most significant bit of the K register 30, i.e. the 15th bit position, is set if the output of the adder 66 is $\leq 0.0625$. On the second iteration the J counter 58 is incremented and the 14th bit position is either set or cleared depending on the value of the adder 66.

The value of the constant used in comparator 72, namely 0.0625, is a result of the number system used. It is desired to obtain K such that $K^2A$ equals some known value W. This makes the magnitude of the complex signal composed of $KI_2$ and $KQ_2$ equal to the square root of W. Since this value is also known, $KI_2$ and $KQ_2$ can be adjusted accordingly to obtain the final desired normalized result. In a 2's complement, fractional, fixed-point number system, K is less than 1. Therefore, $K^2A$ must be less than 0.0625. Consequently, the value determined by the adder 66, namely $K^2A$, is compared to the value 0.0625 (W=0.0625) in comparator 72. This allows K to have a value up to but not including 1. The special case of K=1 can also be allowed by detecting if A is exactly 0.0625, in which case multipliers 46 and 48 are forced to pass $I_2$ and $Q_2$ (equivalent to multiplying each by K =1).

The steps performed in stage 28 may be summarized as follows:
1. Clear X and Y Registers.
2. Set J Counter =0.
3. Calculate the new value of Y.
4. Calculate the new value of X.
5. If the output of adder 66 is $\leq 0.0625$:
   update the X and Y registers, and
   set bit NK-J in the K Register.
6. Increment the J Counter.
7. Repeat steps 3 to 6 until the J Counter =NK. Steps 3 to 6 are executed every CLK3 pulse.
8. Clock the resulting K into pipeline register 32 to complete the process.

If the output of adder 66 is $>0.0625$, then the X and Y registers are not updated and bit NK-J-1 is not set.

Figure 5A:
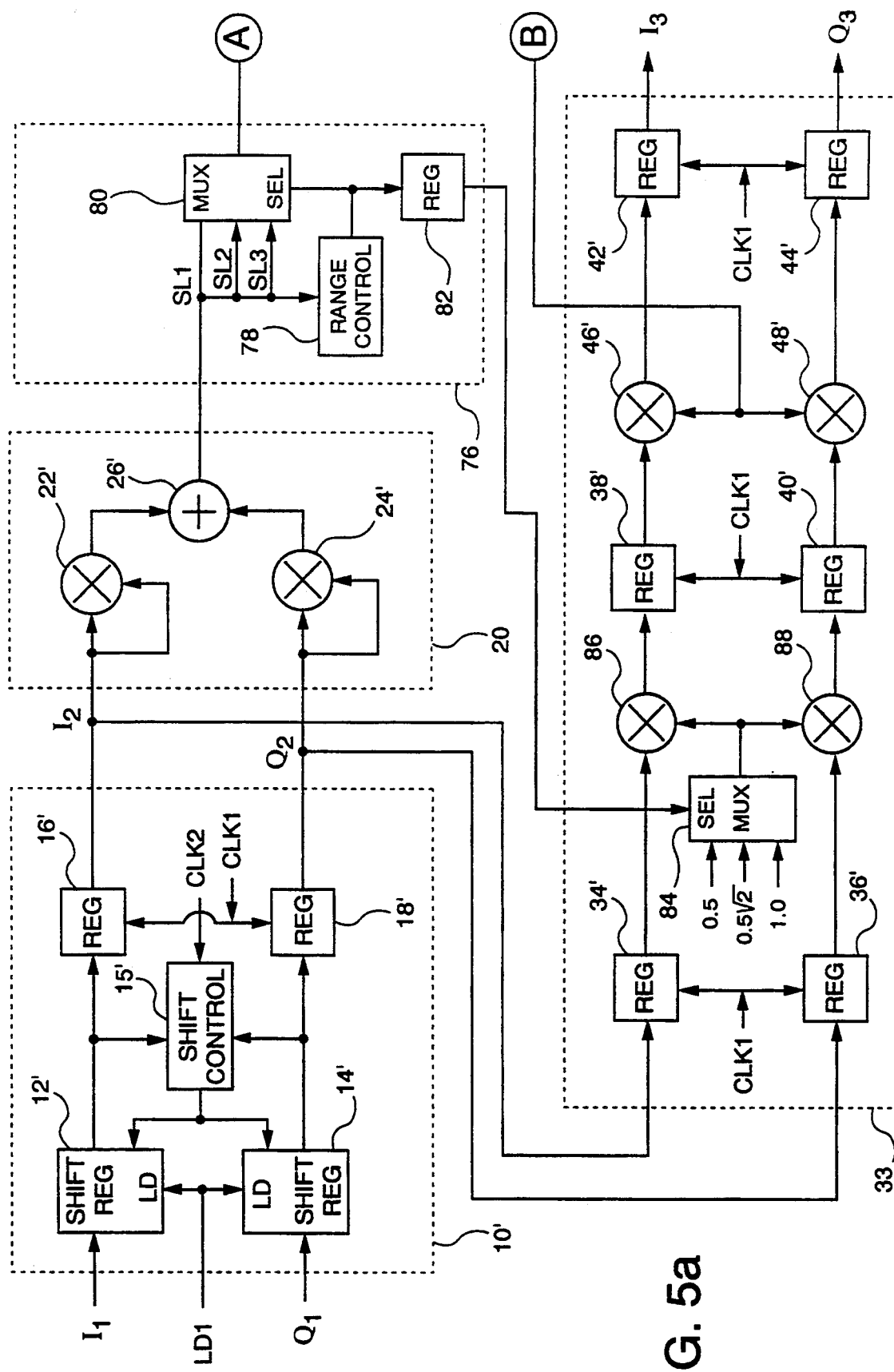
FIGS. 5a and 5b form a detailed block diagram of a second embodiment of the normalizer of the present invention.
Figure 5B:
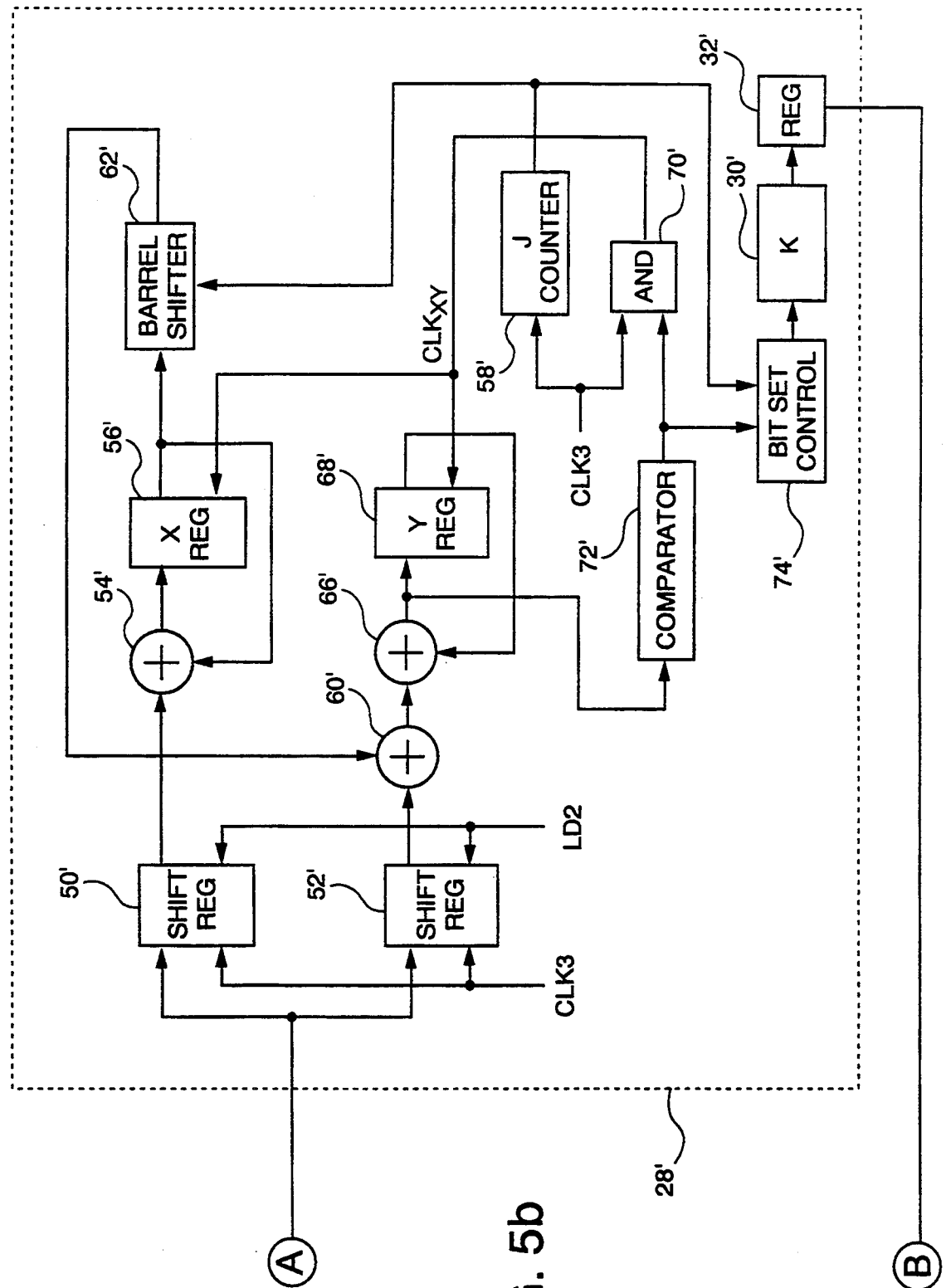

Referring now to FIGS. 5a and 5b, a second embodiment of the invention is shown. Corresponding components from FIGS. 4a and 4b are designated with prime numbers in FIG. 5a and 5b. The method of FIG. 5 adds an extra stage of computation to shift A up one bit at a time to obtain A2, where $0.5 \leq A2 < 1.0$. This allow the elements in the iteration stage 28' to have less bits. The shifting of A means that $I_2$ and $Q_2$ must be adjusted accordingly. The logic for coarse normalization of A to produce A2 is generally designated 76 and includes a range detect block 78 which select the proper number of bit position shifts in a multiplexor 80 needed to bring A into the desired A2 range. A2 is obtained by passing A unmodified if A=0, or by shifting A left one to three bit positions if A>0.

The rules for this operation are:
A2=A, for A=0 (Case 1)
A2=A shifted left 1 bit=2A, for $0.25 \leq A < 0.5$ (Case 2)
A2=A shifted left 2 bits=4A, for $0.125 \leq A < 0.25$ (Case 3)
A2=A shifted left 3 bits =8A, for $0.0 < A < 0.125$ (Case 4).

The two bit code is stored in register 82 and is used to select the proper input for the multiplexor 84 to apply as a multiplier input to the multipliers 86 and 88 to adjust $I_2$ and $Q_2$. These inputs are 0.5 for Case 2, 0.5 sqrt(2) for Case 3 and 1 for Case 4. Registers 34' and 36' provide time alignment with the two bit value in the register 82. Registers 38' and 40' store the results of multipliers 86 and 88 for use by multipliers 46' and 48' and also provide time alignment with the K output from register 32.

In stage 28', an iterative process is performed, one bit at a time, to find K, for Cases 1-4, such that:

$$KA2 = 0.5 \quad (19)$$

The final outputs $I_3$ and $Q_3$ are calculated, as follows, and with the indicated order of operations to keep all numbers in fraction range:

$$I_3 = 4(K(CI_2)), \text{ and} \quad (20)$$

$$Q_3 = 4(K(CQ_2)), \quad (21)$$

where $$C = 0.0 \text{(for Case 1)}, \quad (22)$$

$$C = 0.5 \text{(for Case 2)}, \quad (23)$$

$$C = 0.5 \sqrt{2} \text{ (for Case 3)}, \quad (24)$$

$$C = 1.0 \text{(for Case 4)}. \quad (25)$$

The multiply by 4 operations in (20) and (21) are performed by taking the proper bits from the intermediate values $K(CI_2)$ and $K(CQ_2)$. By using the correct value of C in (20) and (21), and using (7), (19), and the rules for obtaining A2, it can be easily shown that $I_3$ and $Q_3$ as given by (20) and (21) are such that:

$$I_3^2 + Q_3^2 = 1.0. \quad (26)$$

With the exception of $I_1$, $Q_1$, $I_2$, $Q_2$, $I_3$, and $Q_3$, all quantities are always $\geq 0$, and thus hardware that is holding these quantities do not need sign-bits. Furthermore, since C and K are always >0, the multipliers 46, 48, 86, and 88 have one input that is always >0, which may allow further hardware simplification.

Having described a preferred embodiment of our invention, what we claim and desire to secure by U.S. Letters Patent is:

I claim:

1. A method of processing digital signals to normalize multi-bit digital words representing the $I_1$ and $Q_1$ components of a complex signal of the form $I_1 + jQ_1$ to produce corresponding components $I_3$ and $Q_3$, such that the square root of the sum of the squares of $I_3$ and $Q_3$ is equal to 1, comprising the steps of:
   a. performing a coarse normalization of $I_1$ and $Q_1$ to produce components $I_2$ and $Q_2$ respectively,
   b. calculating a value A equal to the sum of the squares of $I_2$ and $Q_2$ so that A is constrained to be equal to or greater than a minimum value R and less than a maximum value S,
   c. iteratively adjusting the value of a digital word K, until $K^2 A = R$
   d. producing the components $I_3$ and $Q_3$, where $I_3 = G(KI_2)$ and $Q_3 = G(KQ_2)$.

2. The method defined in claim 1 wherein R=0.0625, S=0.5, and G=4.

3. The method defined in claim 1 wherein A is coarse normalized to produce a value A2 by shifting A left by 1, 2, or 3 bit positions to accomplish a multiplication of 2, 4 or 8 respectively such that R=0.5 and S=1 and G=4, and multiplying each of $I_2$ and $Q_2$ by $$0.5, \; 0.5\sqrt{2}, \text{ or } 1.0$$

Respectively prior to performing step (d).

4. Apparatus for processing digital signals to normalize multi-bit digital words representing the $I_1$ and $Q_1$ components of a complex signal of the form $I_1 + jQ_1$ to produce corresponding components $I_3$ and $Q_3$, such that the square root of the sum of the squares of $I_1$ and $Q_1$ is equal to 1, comprising:
   means for performing a coarse normalization of $I_1$ and $Q_1$ to produce components $I_2$ and $Q_2$ respectively,
   means for calculating a value A equal to the sum of the squares of $I_2$ and $Q_2$ so that A is constrained to be equal to or greater than a minimum value R and less than a maximum value S,
   means for iteratively adjusting the value of a digital word K, until $K^2 A = R$
   means for producing the components $I_3$ and $Q_3$, where $I_3 = G(KI_2)$ and $Q_3 = G(KQ_2)$.

5. The apparatus defined in claim 4 wherein R=0.0625, S=0.5, and G=4.

6. The apparatus defined in claim 4 further comprising means for coarse normalizing A by shifting A left by 1, 2, or 3 bit positions to accomplish a multiplication of 2, 4 or 8 respectively such that R=0.5, S=1, and G=4 and means for multiplying each of $I_2$ and $Q_2$ by 0.5 when A is shifted 1 bit position, by $$0.5\sqrt{2}$$

when A is shifted by 2 bit positions, and by 1.0 when A is shifted by 3 bit positions.

7. A method of normalizing multi-bit digital words representing the $I_1$ and $Q_1$ components of a complex signal of the form $I_1 + jQ_1$ to produce corresponding components $I_3$ and $Q_3$, where the square root of the sum of the squares of $I_3$ and $Q_3$ is equal to 1, comprising the steps of:
   (a) performing a coarse normalization of the components $I_1$ and $Q_1$ to obtain component $I_2$ and $Q_2$ where each of $|I_2|$ and $|Q_2|$ is less than 0.5 and at least one of $|I_2|$ and $|Q_2|$ is equal to or greater than 0.25, (b) squaring the components $I_2$ and $Q_2$ and adding the squared components to obtain a digital word of value A equal to or greater than 0.0625 and less than 0.5, (c) iteratively adjusting the value of a digital word K, until $K^2A = 0.0625$, (d) producing the components $I_3$ and $Q_3$, where $I = 4(KI_2)$ and $Q_3 = 4(KQ_2)$.

8. The method defined in claim 7 wherein the value A obtained in step (b) is multiplied by a value of 2, 4, or 8 such that A is equal to or greater than 0.5 and less than 1, and wherein the value of K obtained in step (c) is such that $K^2A = 0.5$, and further wherein the component $I_3 = 4(K(CI_2))$ and $Q_3 = 4(K(CQ_2))$ where $C = 0.5$ when A is multiplied by 2, $$C = 0.5\sqrt{2}$$

when A is multiplied by 4, and $C = 1$ when A is multiplied by 8.

* * * * *

UNITED STATES PATENT AND TRADEMARK OFFICE
CERTIFICATE OF CORRECTION

PATENT NO.   :   5,414,735
DATED        :   May 9, 1995
INVENTOR(S)  :   J. William Whikehart It is certified that error appears in the above-indentified patent and that said Letters Patent is hereby corrected as shown below:

On title page, item [75], the
inventor's name should read --J. William Whikehart--.

Signed and Sealed this

Twenty-third Day of April, 1996

Attest:

BRUCE LEHMAN

*Attesting Officer*    *Commissioner of Patents and Trademarks*